United States Patent
Cho

(10) Patent No.: US 7,638,348 B2
(45) Date of Patent: Dec. 29, 2009

(54) MICROLENSES OF CMOS IMAGE SENSOR AND METHOD FOR FABRICATING THE SAME

(75) Inventor: Eun-Sang Cho, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 227 days.

(21) Appl. No.: 11/781,019

(22) Filed: Jul. 20, 2007

(65) Prior Publication Data

US 2008/0023734 A1 Jan. 31, 2008

(30) Foreign Application Priority Data

Jul. 31, 2006 (KR) .................... 10-2006-0072040

(51) Int. Cl.
  *H01L 21/00* (2006.01)
  *H01L 33/00* (2006.01)
(52) U.S. Cl. .................. 438/48; 438/69; 438/70; 438/64; 257/E33.73
(58) Field of Classification Search .................. 438/48, 438/69, 70, 64; 257/E33.073
See application file for complete search history.

(56) References Cited

U.S. PATENT DOCUMENTS

| | | | | |
|---|---|---|---|---|
| 5,321,297 A | * | 6/1994 | Enomoto | .................... 257/432 |
| 5,976,907 A | * | 11/1999 | Shigeta et al. | ................. 438/65 |
| 6,171,885 B1 | * | 1/2001 | Fan et al. | ....................... 438/70 |
| 7,084,472 B2 | * | 8/2006 | Fukuyoshi et al. | .......... 257/432 |
| 7,115,853 B2 | * | 10/2006 | Jiang et al. | ................ 250/208.1 |
| 2006/0012001 A1 | * | 1/2006 | Kim | ........................... 257/432 |

* cited by examiner

Primary Examiner—Luan C Thai
(74) Attorney, Agent, or Firm—Sherr & Vaughn, PLLC

(57) ABSTRACT

A method of fabricating microlenses in a CMOS image sensor including at least one of the following steps: Forming a color filter array including a plurality of color filters on a semiconductor substrater. Forming on and/or over the color filter array a flattening layer to compensate for height differences between color filters. Forming a silicon oxide layer on and/or over the flattening layer. Forming on and/or over the silicon oxide layer, a plurality of photoresist patterns which correspond to the color filters, wherein the photoresist patterns may be separated from each other. Forming a plurality of CxFy-based polymer bumps surrounding the plurality of photoresist patterns using at least one process gas (e.g. $C_5F_8$, $CH_2F_2$, Ar, and/or $O_2$). Etching the plurality of polymer bumps, the plurality of photoresist patterns, and the silicon oxide layer using an etching recipe having substantially the same etching selection ratio between the plurality of polymer bumps, the plurality of photoresist patterns, and the silicon oxide layer.

14 Claims, 3 Drawing Sheets

MICROLENSES OF CMOS IMAGE SENSOR AND METHOD FOR FABRICATING THE SAME

The present application claims priority under 35 U.S.C. 119 to Korean Patent Application No. 10-2006-0072040 (filed on Jul. 31, 2006), which is hereby incorporated by reference in its entirety.

BACKGROUND

An image sensor is a device that may receive light at a photodiode or phototransistor and converts the light into an electrical, digital image signal using an analog to digital converter (ADC). Two different types of image sensors are Complementary Metal Oxide Semiconductor (CMOS) devices and Charge Coupled Devices (CCDs). CMOS devices may be used in low power, small cameras. In CMOS devices, micro lenses (which may be exposed to the air) may focus light on a photodiode. The photodiode may convert the focused light into electrical signals. A plurality of transistors may cause the converted electrical signal to be displayed as an image.

A CMOS device may include a photodiode, at least one transistor, at least one metal wiring layer, and/or at least one interlayer dielectric layer. A metal wiring layer may electrically connect circuit devices in a CMOS device. An interlayer dielectric may insulate circuit devices and metal wiring layers. A CMOS device may include a color filter array including a plurality of color filters. Each color filter may allow transmission of light having a predefined wavelength range, which may correspond to one of the three primary colors (i.e. red, blue, and green). Color filters may be formed over and/or on an upper interlayer dielectric layer. A CMOS device may include a plurality of microlenses corresponding to the plurality of filters formed over and/or on the color filter array. A CMOS device may include a flattening layer that compensates for the difference in height between the color filters. A flattening layer may be between the plurality of microlenses and the color filter array.

Microlenses may be formed to maximize the effect of the color filter array. To form the microlenses, predetermined patterns may be formed using a relatively highly transparent photoresist. Photoresist patterns may be formed into microlenses through a thermal process.

Figure 1A:
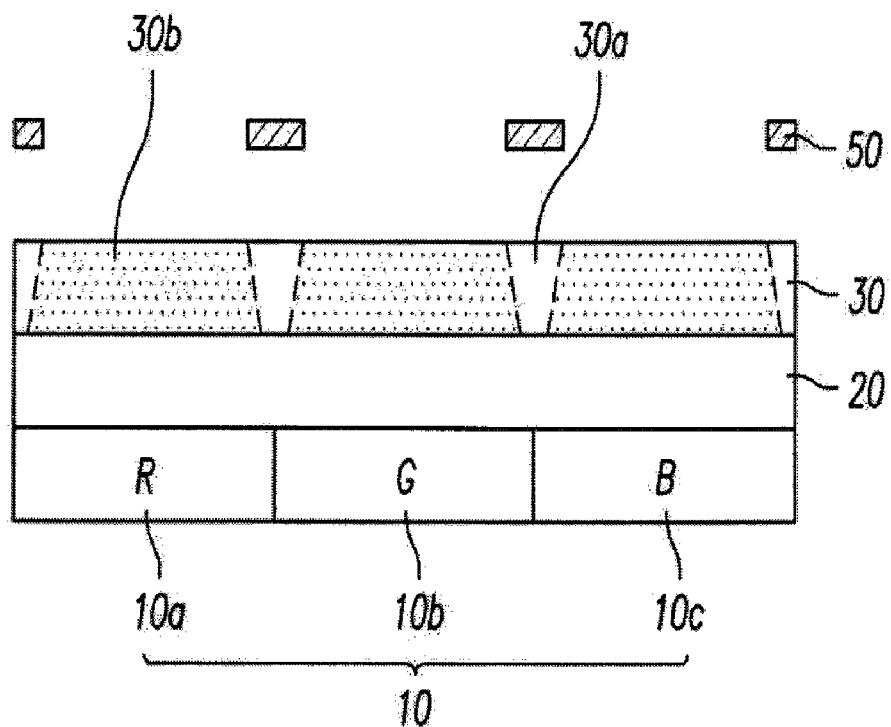
Figure 1B:
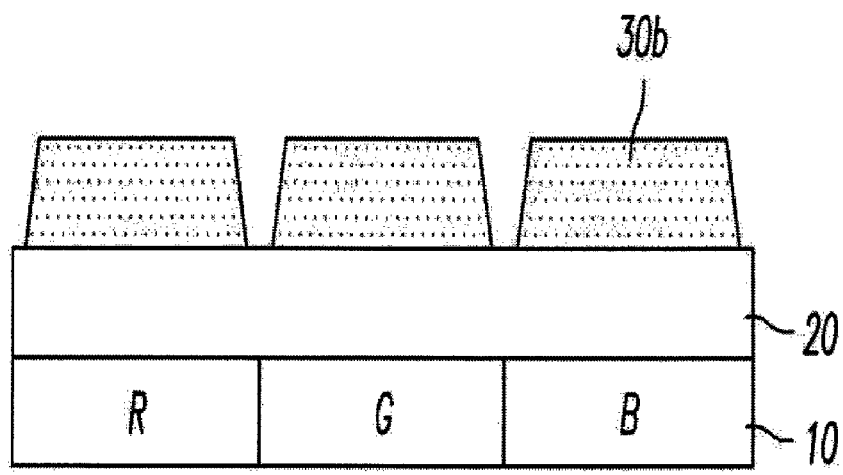
Figure 1C:
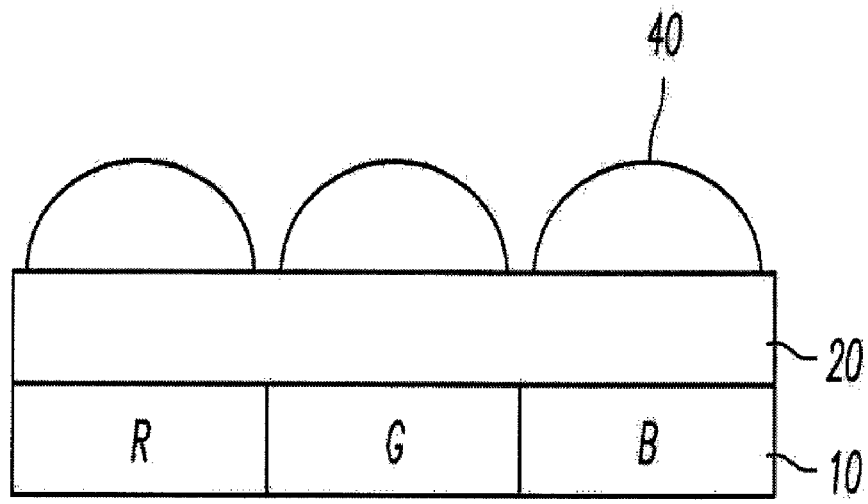

Example FIGS. 1A to 1C illustrate a method of forming a microlens. As illustrated in example FIG. 1A, a red filter 10a, a green filter 10b, and a blue filter 10c may be formed over an upper interlayer dielectric layer of an image device. The upper interlayer dielectric layer and at least one metal wiring layer may be formed over a semiconductor substrate. A photodiode and a plurality of transistors may be formed on and/or over the semiconductor substrate.

A flattening layer 20 may be formed on and/or over color filter array 10 to compensate for differences in height between the filters 10. Photoresist film 30 may be formed on and/or over flattening layer 20. Photoresist film 30 may be exposed to light through mask 50 having a predetermined pattern to shape microlenses to have hemispherical shapes. Defocus exposure may be performed to allow unexposed portions 30b of the photoresist film 30 to have inclined sides. Unexposed portions 30b may be removed through development, thereby forming photoresist patterns 30b having a trapezoidal shape. As illustrated in FIG. 1C, photoresist patterns 30b are subjected to reflow and/or hardening processes to form microlenses 40 having substantially a hemispherical shape.

The features or characteristics of CMOS image sensors may be affected by combinations of different factors, such as focusing distance of microlenses, size and degree of distribution of color filters, thickness of interlayer dielectric layers, and/or pitch of photodiodes. It may be difficult to standardize microlens focusing distances due to variations in a manufacturing process, thus limiting reproducibility of microlenses. For example, it may be difficult to standardize a reflow process. For example, photoresist patterns 30b of FIG. 1B should be formed far enough away from each other to prevent bridges from being formed. Likewise, microlenses 40 should have enough separation from each other to avoid crosstalk.

SUMMARY

Embodiments relate to microlenses of a CMOS image sensor and a method of fabricating microlenses. In embodiments, microlenses are formed using a silicon oxide layer. In embodiments, microlenses are formed with relatively high reproducibility. In embodiments, microlenses may have a relatively high hardness and/or may be separated from each other at minimal intervals to prevent crosstalk and other effects.

Embodiments relate to a method of fabricating microlenses of a CMOS image sensor including at least one of the following steps: Forming a color filter array including a plurality of color filters on a semiconductor substrate, wherein the semiconductor substrate includes a photodiode and a MOS transistor. Forming on and/or over the color filter array a flattening layer to compensate for height differences between color filters. Forming a silicon oxide layer on and/or over the flattening layer. Forming on and/or over the silicon oxide layer, a plurality of photoresist patterns which correspond to the color filters, wherein the photoresist patterns may be separated from each other. Forming a plurality of CxFy-based polymer bumps surrounding the plurality of photoresist patterns using at least one process gas (e.g. $C_5F_8$, $CH_2F_2$, Ar, and/or $O_2$). Etching the plurality of polymer bumps, the plurality of photoresist patterns, and the silicon oxide layer using an etching recipe having substantially the same etching selection ratio between the plurality of polymer bumps, the plurality of photoresist patterns, and the silicon oxide layer.

Embodiments relate to a CMOS image sensor that may include at least one of a photodiode, a plurality of MOS transistors, at least one metal wiring layer, a plurality of interlayer dielectric layers, a color filter array including a plurality of color filters, and a plurality of microlenses, wherein the plurality of microlenses are formed of silicon oxide material that is transparent to visible light.

DRAWINGS

Example FIGS. 1A to 1C are sectional views of a CMOS image sensor illustrating fabrication of microlenses.

Figure 2A:
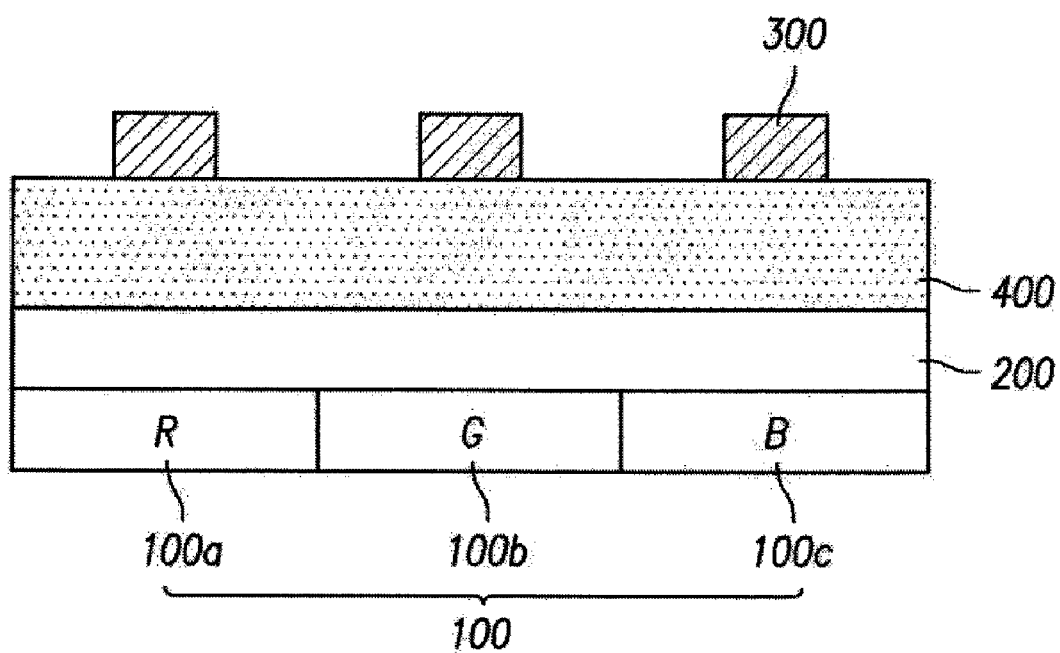
Figure 2B:
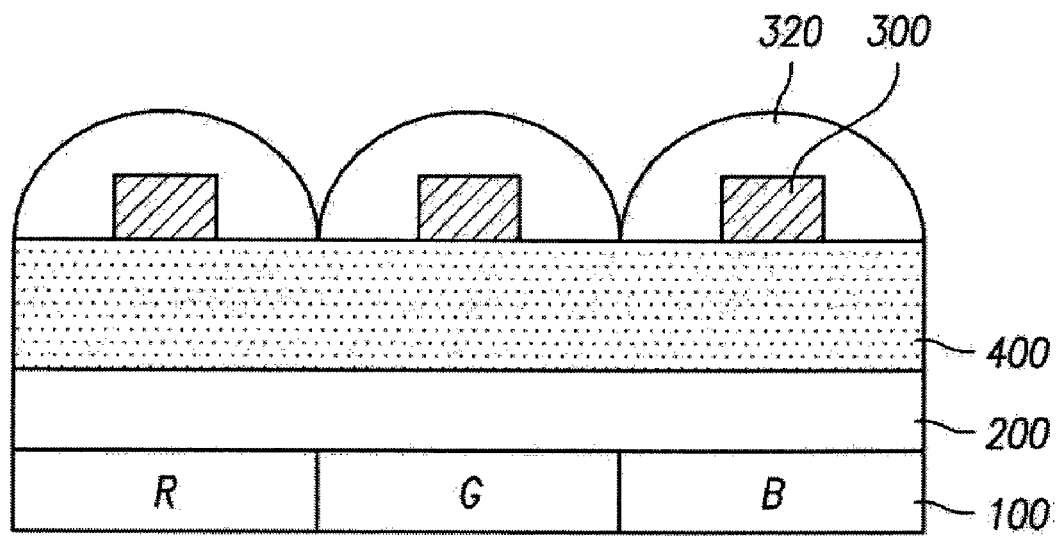
Figure 2C:
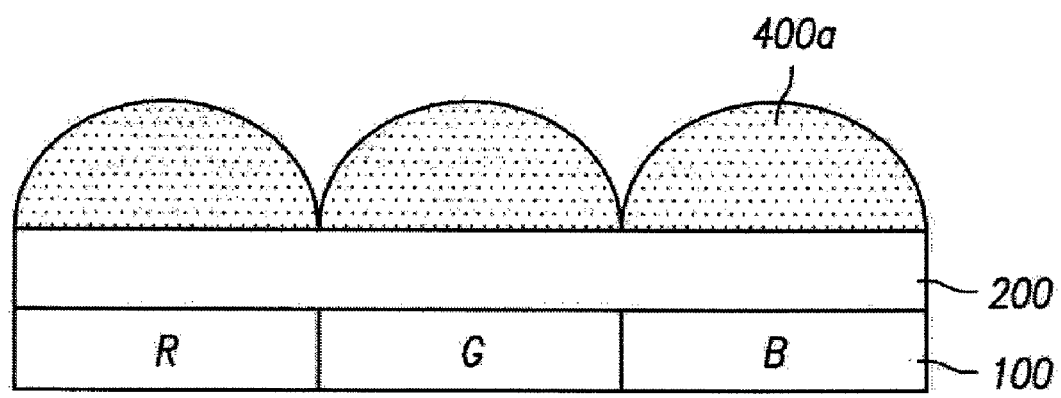

Example FIGS. 2A to 2C are sectional views of a CMOS image sensor illustrating fabrication of microlenses, in accordance with embodiments.

DESCRIPTION

As illustrated in example FIG. 2A, color filter array 100 and/or flattening layer 200 may be formed on and/or over a semiconductor substrate, in accordance with embodiments.

A silicon oxide layer $SiO_2$ 400 with a predetermined thickness may be formed on and/or over flattening layer 200 and/or color filter array 100.

A plurality of metal wiring layers for electrically connecting circuit elements may be formed on and/or over a semiconductor substrate. Circuit elements (e.g. a photo diode and/or a plurality of MOS transistors) may be formed on and/over the semiconductor substrate. A plurality of interlayer dielectric layers may be formed to electrically insulate circuit elements and/or metal wiring layers. A color filter array 100 (e.g. including a red filter 100a, a green filter 100b, and/or a blue filter 100c) may be formed on and/or over an upper interlayer dielectric layer. A flattening layer 200 may be formed on and/or over color filter array 100 and may compensate for differences in height between different color filters.

Silicon oxide layer 400 may be formed over flattening layer 200, in accordance with embodiments. Silicon oxide layer 400 may be the material from which microlenses may be formed. In embodiments, silicon oxide layer 400 may be formed of a material transparent or substantially transparent to visible light. Silicon oxide layer 400 may be deposited by a low temperature Chemical Vapor Deposition (CVD) technique, although other deposition processes would be appreciated by those skilled in the art. In embodiments, silicon oxide layer 400 may be deposited having a thickness that is approximately the thickness of microlenses to be formed.

A plurality of photoresist patterns 300 that correspond to the color filters may be formed on and/or over silicon oxide layer 400, in accordance with embodiments. As illustrated in FIG. 2A, photoresist patterns 300 may be formed to have a rectangular shape, in accordance with embodiments. In embodiments, photoresist patterns 300 may be formed to have a trapezoidal shape. Photoresist patterns 300 having a trapezoidal shape by be formed using defocus exposure, in accordance with embodiments. One of ordinary skill in the art would appreciate other shapes of photoresist patters 300 and/or formation methods.

In embodiments, a plurality of CxFy-based polymer bumps 320 may be formed on and/or over photoresist patterns 300, as illustrated in example FIG. 2B. In embodiments, polymer bumps 320 may be formed surround photoresist patterns 300. In embodiments, polymer bumps 320 may substantially have a hemispherical shape. In accordance with embodiments, polymer bumps 320 may be formed by introducing process gases (e.g. $C_5F_8$, $CH_2F_2$, Ar, and/or $O_2$) into a dry etching chamber. When an etching process is performed by introducing process gases into the dry etching chamber, photoresist patterns 300 and the silicon oxide layer 400 may be substantially unaffected (e.g. substantially not etched).

During an etching process CxFy-based polymers may be generated as a byproduct of the reaction, in accordance with embodiments. In embodiments, if generated polymers are not discharged in a chamber leaving polymers over the substrate, the polymers may be attached around photoresist patterns 300. Under certain process conditions (e.g. appropriate control of residence time of the polymers), a plurality of substantially hemispherical polymer bumps 320 may be coated on and/or over photoresist patterns 300. In embodiments, forming photoresist patterns 300 in a trapezoidal shape (e.g. using defocus exposure) may be effective for coating polymer bumps 320 having substantially hemispherical shapes.

In embodiments, CxFy-based polymer bumps 320 may be formed using $C_5H_8$ of 15-25 sccm, $CH_2F_2$ of 3-7 sccm, Ar of 100-140 sccm, and/or $O_2$ of 4-8 sccm. The polymer bumps 320 may be reliably generated by employing a process gas partial pressure ratio of 1:2.5-4.2:0.5-1.2:16-24 between the process gases $O_2$, $C_5F_8$, $CH_2F_2$, and Ar, respectively (i.e. $C_5F_8$ is 2.5-4.2, $CH_2F_2$ is 0.5-1.2, and Ar is 16-24 when $O_2$ is assumed to be "1").

As illustrated in FIG. 2C, a reactive ion etching process may be performed, in accordance with embodiments. This process uses an etching recipe having substantially the same etching selection ratio between the photoresist patterns 300, the CxFy-based polymer bumps 320, and the silicon oxide layer 400 (i.e., the etching selection ratio between the three is 1:1:1). This allows the hemispherical profile of the coated polymer bumps 320 to be translated into substantially the same hemispherical profile in silicon oxide layer 400, as a result of etching, in accordance with embodiments. Accordingly, as a result of etching, hemispherical microlenses 400a are formed after photoresist patterns 300 and the polymer bumps 320 are removed by etching.

Embodiments may optimize reproducibility of microlenses. In embodiments, microlenses may be formed with minimal intervals between them. Formation of microlenses may be relatively accurately controlled, in accordance with embodiments, which may minimize crosstalk between CMOS image sensors.

In embodiments, a relatively hard microlens may be advantageous since microlens are exposed to the air. For example, photoresist-based microlenses may be susceptible to generation of particles during a process of scribing chips, which is avoided with a relatively hard microlens.

It will be apparent to those skilled in the art that various modifications and variations can be made to embodiments without departing from the spirit or scope of the disclosed embodiments. Thus, it is intended that the present invention covers modifications and variations of this invention provided they come within the scope of the appended claims and their equivalents.

What is claimed is:

1. A method comprising:
   forming a substantially transparent layer over at least one color filter;
   forming at least one photoresist pattern over the substantially transparent layer;
   forming at least one substantially hemispherical polymer bump around said at least one photoresist pattern; and
   etching said at least one substantially hemispherical polymer bump, said at least one photoresist pattern, and said substantially transparent layer to form at least one transparent pattern in the substantially transparent layer, wherein said at least one transparent pattern has a shape substantially the same as said at least one substantially hemispherical polymer bump, and
   wherein said at least one polymer bump, said at least one photoresist pattern, and the substantially transparent layer have approximately the same etch sensitivity to an etching process.

2. The method of claim 1, wherein the substantially transparent layer comprises silicon dioxide.

3. The method of claim 1, wherein said at least one photoresist pattern has a rectangular shape.

4. The method of claim 1, wherein said at least one photoresist pattern has a trapezoidal shape.

5. The method of claim 4, wherein the trapezoidal shape is formed by defocus exposure.

6. The method of claim 1, wherein said at least one polymer bump comprises a CxFy-based polymer.

7. The method of claim 6, wherein said at least one polymer bump is formed by using at least one of $C_5F_8$, $CH_2F_2$, Ar, and $O_2$ as a process gas.

8. The method of claim 7, wherein said at least one polymer bump is formed in a dry etching chamber by introducing process gases including at least one of:

$C_5F_8$ between approximately 15 sccm and approximately 25 sccm;

$CH_2F_2$ between approximately 3 sccm and approximately 7 sccm;

Ar between approximately 100 sccm and approximately 140 sccm; and $O_2$ between approximately 4 sccm and approximately 8 sccm.

9. The method of claim 8, wherein a process gas partial pressure ratio between the process gases is:

1:2.5-4.2 for $O_2:C_5F_8$;
1:0.5-1.2 for $O_2:CH_2F_2$; and
1:16-24 for $O_2:Ar$.

10. An apparatus comprising at least one substantially transparent pattern formed over at least one color filter, wherein said at least one substantially transparent pattern is formed by:

forming a substantially transparent layer over said at least one color filter;

forming at least one photoresist pattern over the substantially transparent layer;

forming at least one substantially hemispherical polymer bump around said at least one photoresist pattern; and etching said at least one substantially hemispherical polymer bump, said at least one photoresist pattern, and the substantially transparent layer to form said at least one transparent pattern in the substantially transparent layer, wherein said at least one transparent pattern has a shape substantially the same as said at least one substantially hemispherical polymer bump, and wherein said at least one polymer bump, said at least one photoresist pattern, and the substantially transparent layer have approximately the same etch sensitivity to an etching process.

11. The apparatus of claim 10, wherein the substantially transparent layer comprises silicon dioxide.

12. The apparatus of claim 10, wherein said at least one photoresist pattern has at least one of a rectangular shape and a trapezoidal shape.

13. The apparatus of claim 10, wherein said at least one polymer bump comprises a CxFy-based polymer.

14. The apparatus of claim 13, wherein said at least one polymer bump is formed by using at least one of $C_5F_8$, $CH_2F_2$, Ar, and $O_2$ as a process gas, wherein:

said at least one polymer bump is formed in a dry etching chamber by introducing process gases including at least one of:

$C_5F_8$ between approximately 15 sccm and approximately 25 sccm, $CH_2F_2$ between approximately 3 sccm and approximately 7 sccm, Ar between approximately 100 sccm and approximately 140 sccm, and $O_2$ between approximately 4 sccm and approximately 8 sccm; and a process gas partial pressure ratio between the process gases is:

1:2.5-4.2 for $O_2:C_5F_8$,
1:0.5-1.2 for $O_2:CH_2F_2$, and
1:16-24 for $O_2:Ar$.

* * * * *